(12) United States Patent
Kato et al.

(10) Patent No.: US 7,453,099 B2
(45) Date of Patent: Nov. 18, 2008

(54) SEMICONDUCTOR LIGHT EMITTING DEVICE

(75) Inventors: Yuko Kato, Fujisawa (JP); Hidefumi Yasuda, Kawasaki (JP); Kazuyoshi Furukawa, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/538,646

(22) Filed: Oct. 4, 2006

(65) Prior Publication Data

US 2007/0114550 A1    May 24, 2007

(30) Foreign Application Priority Data

Oct. 5, 2005    (JP)    ............... 2005-292608

(51) Int. Cl.
*H01L 33/00*    (2006.01)
(52) U.S. Cl. .......................................... 257/98; 257/99
(58) Field of Classification Search .................. 257/98, 257/99, 88, 79
See application file for complete search history.

(56) References Cited

U.S. PATENT DOCUMENTS

| 7,294,866 B2 * | 11/2007 | Liu ............................. 257/100 |
| 2004/0012013 A1 * | 1/2004 | Katayama .................... 257/13 |
| 2005/0189556 A1 | 9/2005 | Yasuda et al. |
| 2006/0043386 A1 | 3/2006 | Furukawa et al. |
| 2006/0043399 A1 | 3/2006 | Miyagaki et al. |

FOREIGN PATENT DOCUMENTS

| JP | 6-5912 | 1/1994 |
| JP | 6-177420 | 6/1994 |
| JP | 6-188450 | 7/1994 |
| JP | 3312049 | 5/2002 |

OTHER PUBLICATIONS

U.S. Appl. No. 11/538,646, filed Oct. 4, 2006, Kato et al.
U.S. Appl. No. 11/589,087, Oct. 30, 2006, Yasuda et al.
U.S. Appl. No. 11/621,638, filed Jan. 10, 2007, Furukawa et al.
U.S. Appl. No. 11/538,646, Oct. 4, 2006, Kato et al.
U.S. Appl. No. 11/342,539, filed Jan. 31, 2006, Yuko Kato et al.

* cited by examiner

*Primary Examiner*—Thien F Tran
(74) *Attorney, Agent, or Firm*—Oblon, Spivak, McClelland, Maier & Neustadt, P.C.

(57) ABSTRACT

A semiconductor light emitting device has a transparent layer having a first main surface and a second main surface at a side opposite to the first main surface, a plurality of light emitting sections arranged in at least one line on the first main surface of the transparent layer, each of the plurality of light emitting sections having an active layer and a tapered section, the tapered section reflecting light emitted from the active layer to the direction of the transparent layer, each of the plurality of light emitting sections having a central portion and a peripheral portion and having light intensity distribution on a second main surface of the transparent layer, on the second main surface of the transparent layer, light intensity at a region opposite to the peripheral portion being equal to or more than light intensity at a region opposite to the central portion, and a plurality of contact sections arranged opposite to the central portion on the second main surface of the transparent layer, each of the plurality of contact sections being opaque with respect to emission wavelengths of the plurality of light emitting sections.

10 Claims, 11 Drawing Sheets

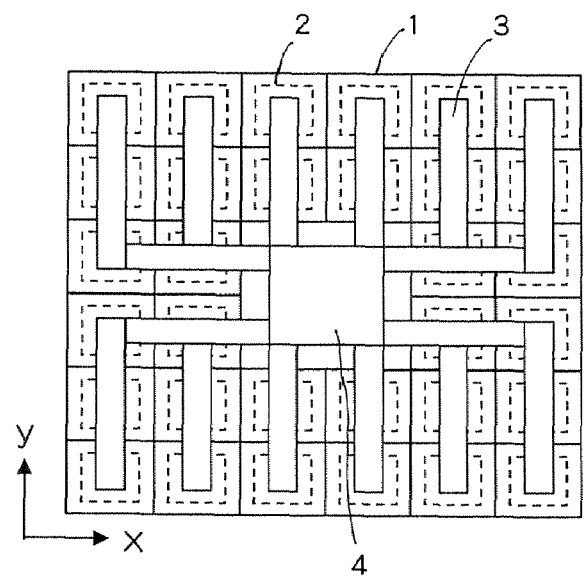
F I G. 5
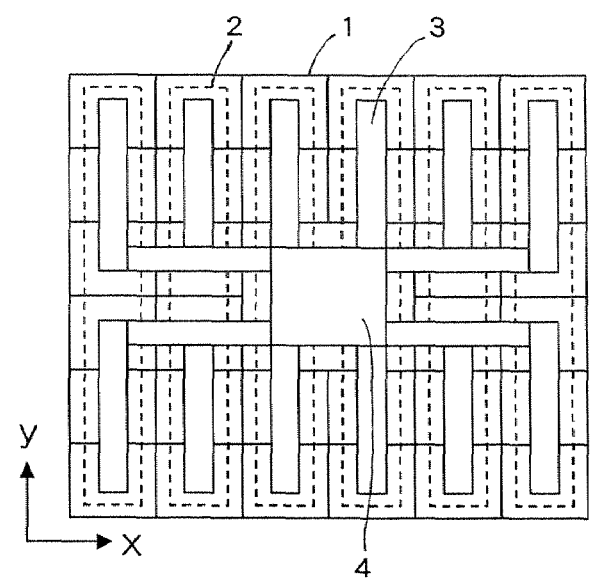
F I G. 6

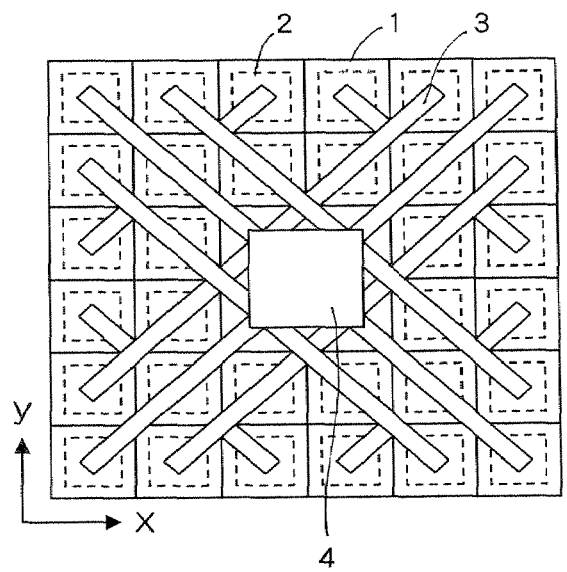
F I G. 7
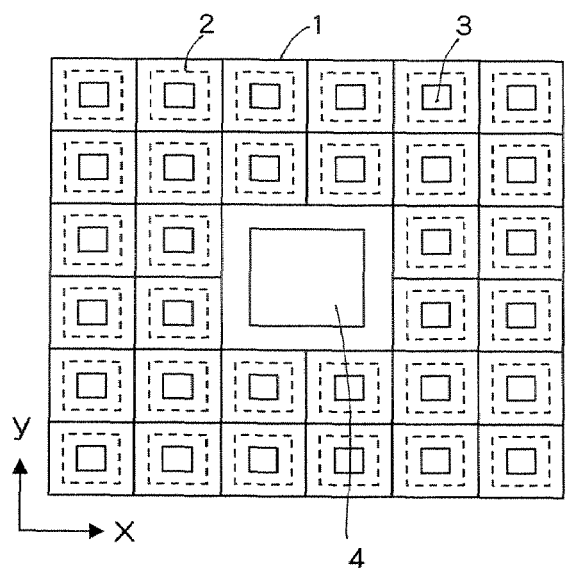
F I G. 8

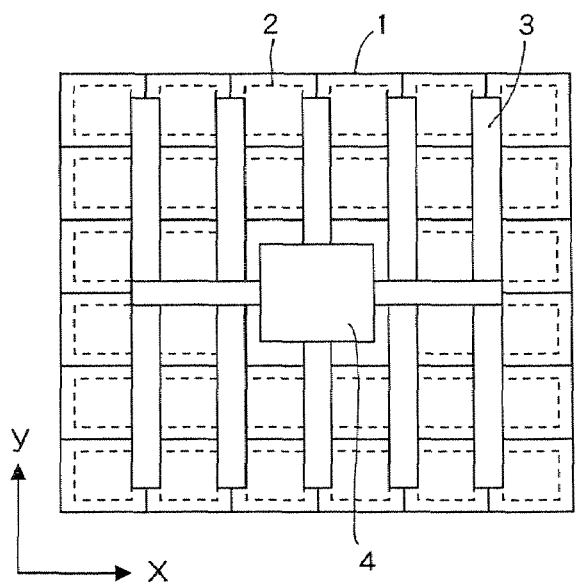
F I G. 13
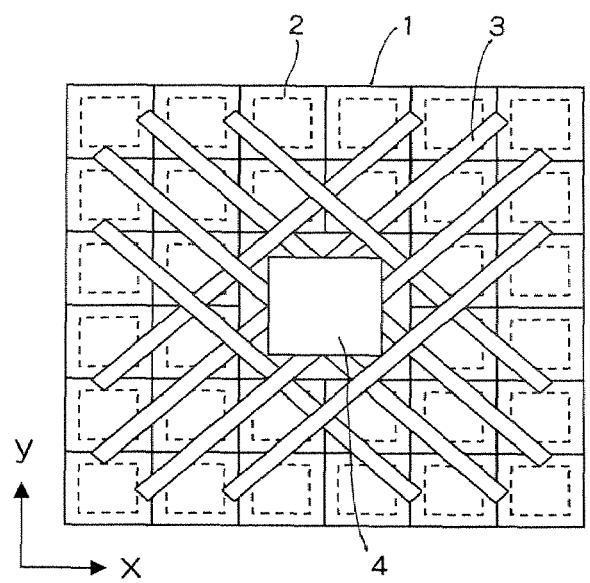
F I G. 14

F I G. 20A
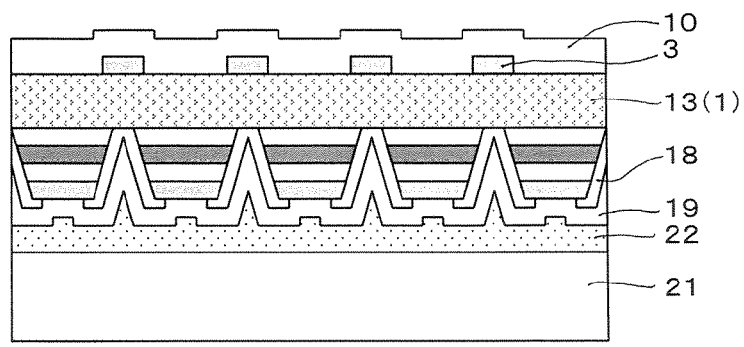
F I G. 20B
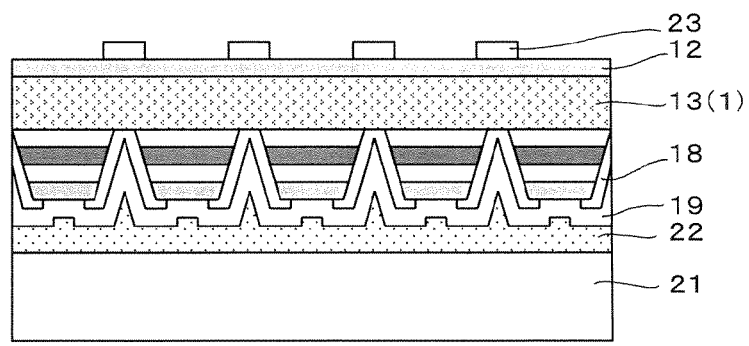
F I G. 20C
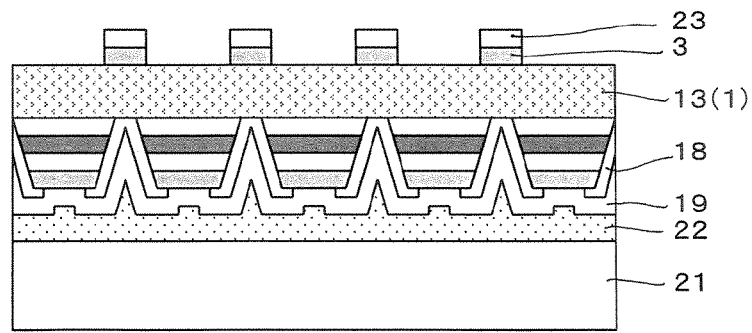

SEMICONDUCTOR LIGHT EMITTING DEVICE

CROSS REFERENCE TO RELATED APPLICATIONS

This application is based upon and claims the benefit of priority from the prior Japanese Patent Application No. 2005-292608, filed on Oct. 5, 2005, the entire contents of which are incorporated herein by reference.

BACKGROUND OF THE INVENTION

1. Field of the Invention

The present invention relates to a semiconductor light emitting device having a plurality of light emitting sections.

2. Related Art

There has been proposed a semiconductor light emitting device in which in order to increase light emission intensity, a plurality of light emitting sections are vertically and horizontally arranged on a substrate, and light is taken out from the direction of the substrate surface opposite to the surface on which the light emitting sections are arranged The intensity of light taken out to the light taking-out surface side can be further increased by devising the shape of light emitting section or increasing the number of light emitting sections arranged on the substrate.

In the semiconductor light emitting device of this type, electrodes are provided on both sides of the substrate. However, since the electrode material is generally opaque, there is a problem that light is shielded by the electrodes, and thereby the intensity of light is lowered.

In order to solve this problem, it is conceivable, for example, to reduce the electrode area with respect to the area of the light emitting section. However, in this case, the current flowing through the light emitting section is also limited, as a result of which the light emission intensity is also lowered. On the other hand, it is also possible to use transparent electrodes made of ITO (Indium Tin Oxide) or the like, as the electrode material. However, a transparent electrode in general has a large resistance to cause a voltage drop, as a result of which the light emission intensity of the light emitting section also cannot be improved.

On the other hand, there is proposed a semiconductor light emitting device in which by forming grooves with inclined side surfaces by using a V-shaped dicing blade, the quantity of emitted light proceeding toward an electrode on the light emitting surface from positions opposite to the electrode on the light emitting surface is substantially reduced, thereby increasing the quantity of light incident on the light emitting surface except portions at which the electrode is formed (Japanese Patent No. 3312049, paragraphs 0073 to 0075, FIG. 13).

In the patent document 1, the electrode on the light emitting surface and the groove formed by using the dicing blade are arranged opposite to one another. However, the light intensity on the light emitting surface is to be varied depending upon the kind of light emitting section. Thus, in the case where the electrode is arranged at a place where the light intensity is originally high, even when the groove formed by using the dicing blade is arranged opposite to the electrode, the light emission efficiency may not be improved so much.

SUMMARY OF THE INVENTION

According to one embodiment of the present invention, a semiconductor light emitting device, comprising:

a transparent layer having a first main surface and a second main surface at a side opposite to the first main surface; a plurality of light emitting sections arranged in at least one line on the first main surface of the transparent layer, each of the plurality of light emitting sections having an active layer and a tapered section, the tapered section reflecting light emitted from the active layer to the direction of the transparent layer, each of the plurality of light emitting sections having a central portion and a peripheral portion and having light intensity distribution on a second main surface of the transparent layer, on the second main surface of the transparent layer, light intensity at a region opposite to the peripheral portion being equal to or more than light intensity at a region opposite to the central portion; and a plurality of contact sections arranged opposite to the central portion on the second main surface of the transparent layer, each of the plurality of contact sections being opaque with respect to emission wavelengths of the plurality of light emitting sections.

Furthermore, according to one embodiment of the present invention, a semiconductor light emitting device, comprising:

a transparent layer having a first main surface and a second main surface at a side opposite to the first main surface;

a plurality of light emitting sections arranged in at least one line on the first main surface of the transparent layer, each of the plurality of light emitting sections having an active layer and a tapered section, the tapered section reflecting light emitted from the active layer to the direction of the transparent layer, each of the plurality of light emitting sections having a central portion and a peripheral portion and having light intensity distribution on a second main surface of the transparent layer, on the second main surface of the transparent layer, light intensity at a region opposite to the central portion being equal to or more than light intensity at a region opposite to the peripheral portion ; and a plurality of contact sections arranged opposite to the peripheral portion or between the neighboring two light emitting sections on the second main surface of the transparent layer, each of the plurality of contact sections being opaque with respect to emission wavelengths of the plurality of light emitting sections.

BRIEF DESCRIPTION OF THE DRAWINGS

FIG. 5 is a top view of the first embodiment;

FIG. 6 is a top view showing an example in which line-shaped light emitting sections 2 are arranged in parallel with each other;

FIG. 7 is a top view showing an example in which a plurality of contact sections 3 are arranged in the diagonal direction with respect to the direction in which light emitting sections 2 are arranged;

FIG. 8 is a top view showing an example in which a separated independent contact section 3 is arranged at a portion opposite to the central portion in each of the light emitting sections 2;

FIG. 13 is a top view of the second embodiment;

FIG. 14 is a top view in the case where a plurality of contact sections 3 are formed in the diagonal direction with respect to the direction in which light emitting sections 2 are arranged;

FIG. 20 is a process chart following the manufacturing process shown in FIG. 19.

DETAILED DESCRIPTION OF THE INVENTION

In the following, preferable embodiments according to the present invention will be described with reference to the accompanying drawings.

FIRST EMBODIMENT

Figure 1:
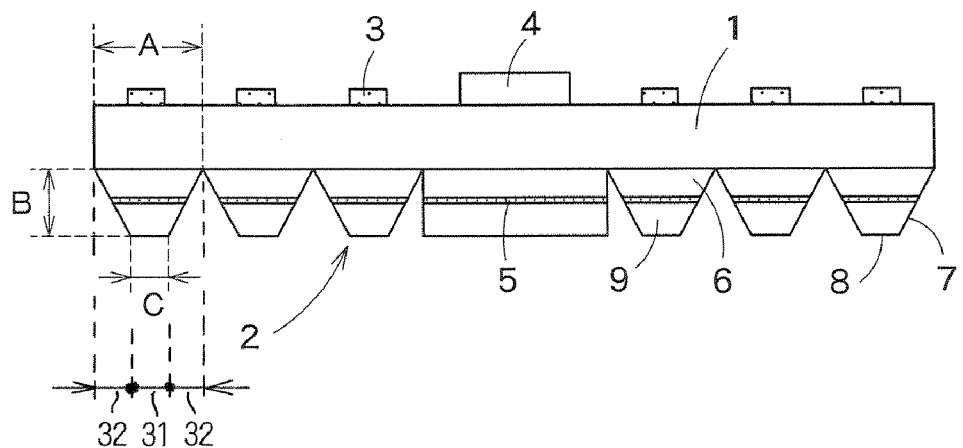
FIG. 1 is a sectional view of a major portion of a semiconductor light emitting device according to a first embodiment of the present invention.

FIG. 1 is a sectional view of a major portion of a semiconductor light emitting device according to a first embodiment of the present invention. The semiconductor light emitting device shown in FIG. 1 is provided with a plurality of light emitting sections 2 vertically and horizontally arranged on a lower surface which is a first main surface of a transparent layer 1, a plurality of contact sections 3 arranged on an upper surface which is a second main surface of the transparent layer 1 at the side opposite to the light emitting sections 2, and a pad 4 which is electrically conductive to the contact sections 3.

Figure 2:
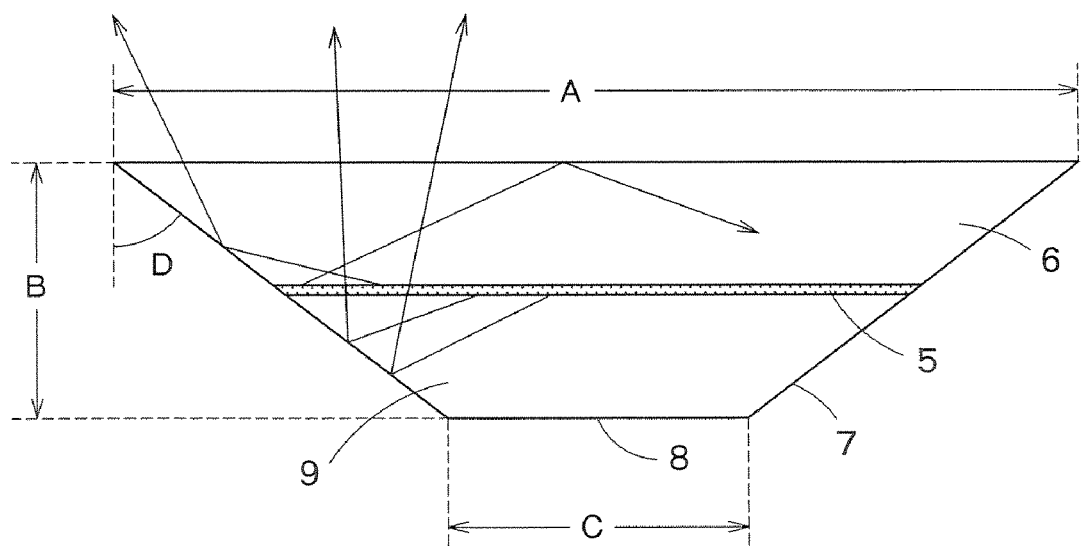
FIG. 2 is an enlarged view of one light emitting section 2.

Each of the a plurality of light emitting sections 2 has, as shown on an enlarged scale in FIG. 2, an active layer 5 which emits light, and a first and second clad layers 6 and 9 which are arranged on both sides of the active layer 5 so as to sandwich the active layer 5. Tapered sections 7 processed into a tapered shape are formed on the side wall portions of the light emitting section 2, and a flat section 8 is formed on the base surface of the light emitting section 2. An electrode is formed on the flat section 8.

The light emitted from the active layer 5 is diffused in all directions. However, the light reaching the tapered section 7 is reflected by the tapered section 7 and is incident on the upper surface (the second main surface) of the transparent layer 1 from the substantially perpendicular direction. Thus, most of the incident light is taken out to the outside. If the side wall of the light emitting section 2 is not formed into the tapered shape and is perpendicular to the substrate surface, the light reflected by the side wall is incident on the upper surface of the transparent layer 1 from an oblique direction and is totally reflected. Thereafter, the total reflection of the light is repeated in the inside, so that the light cannot be taken out to the outside. Thus, by making the side wall of the light emitting section 2 processed into the tapered shape, it is possible to prevent the total reflection of the light on the upper surface of the transparent layer 1, and to effectively lead the light emitted from the active layer 5 through the transparent layer 1 to the outside.

In FIGS. 1 and 2, "A" denotes the width of one light emitting section, "B" denoted the depth of the processed tapered section 7 called "taper depth" hereinafter, "C" is the width of the flat section 8, and "D" is the angle of the tapered section 7 called "taper angle". The taper angle D is defined as a tiled angle with respect to a normal line direction of the transparent layer 1, i.e. a depth direction. "E" denotes an interval between neighboring light emitting sections 2 (see FIG. 12).

The intensity of light emitted from the light emitting section 2 is different depending on positions. The light intensity distribution depends upon the taper angle D, the taper depth B, the interval E between the neighboring light emitting sections 2, a ratio C/A of the length C of the flat section 8 to the length A in the horizontal direction of the light emitting section 2 and the like.

Here, the light intensity distribution in the present specification and claims indicates the light intensity distribution on the upper surface of the transparent layer 1. The light intensity according to the present specification and claims indicates light intensity per unit area. For example, the unit of the light intensity is lm (lumen) per $m^2$.

Figure 3:
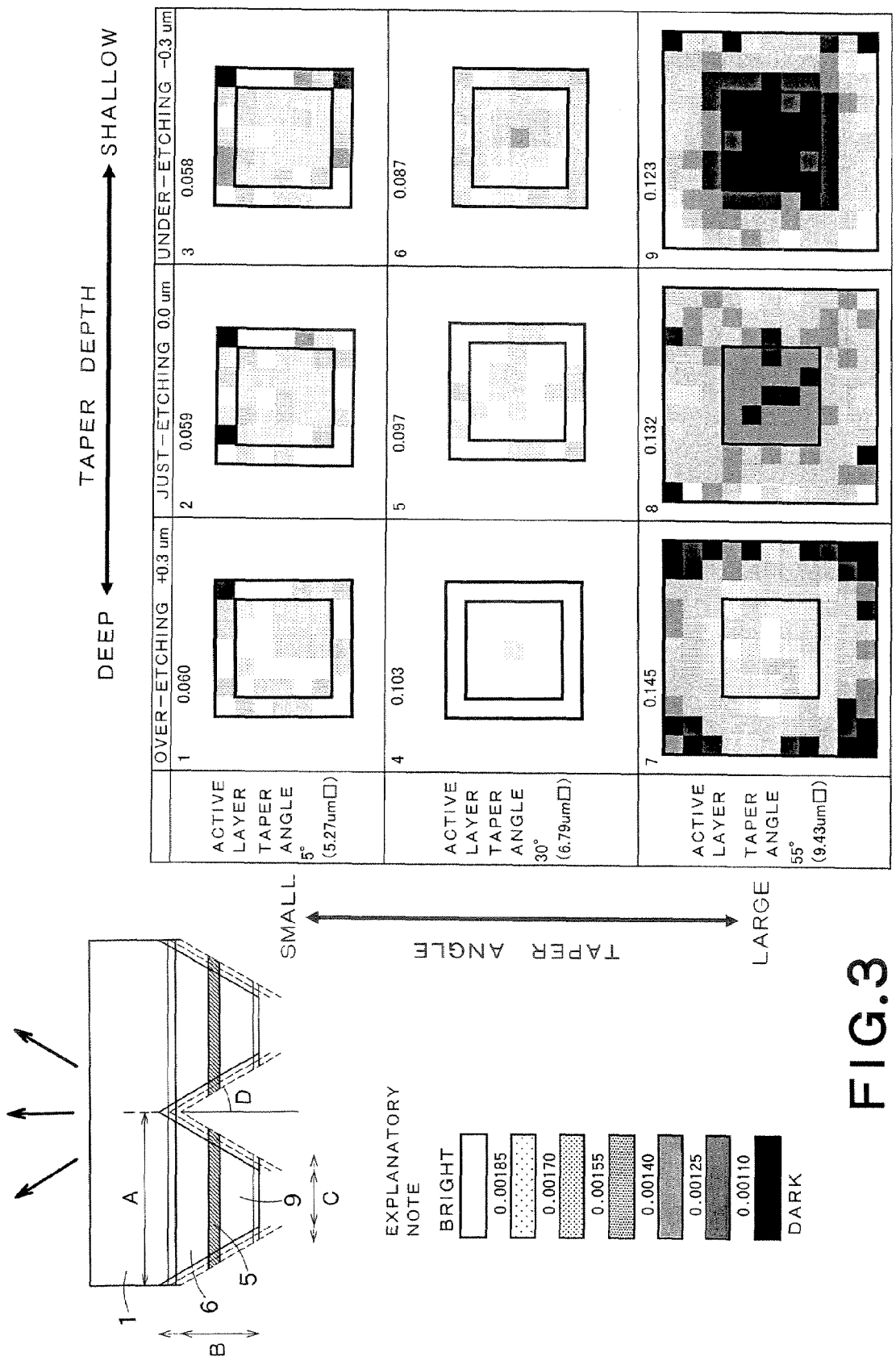
FIG. 3 is a figure showing the effect of taper angle D and taper depth B on the light intensity distribution when an interval E between adjacent light emitting sections 2 is set to zero.
Figure 4:
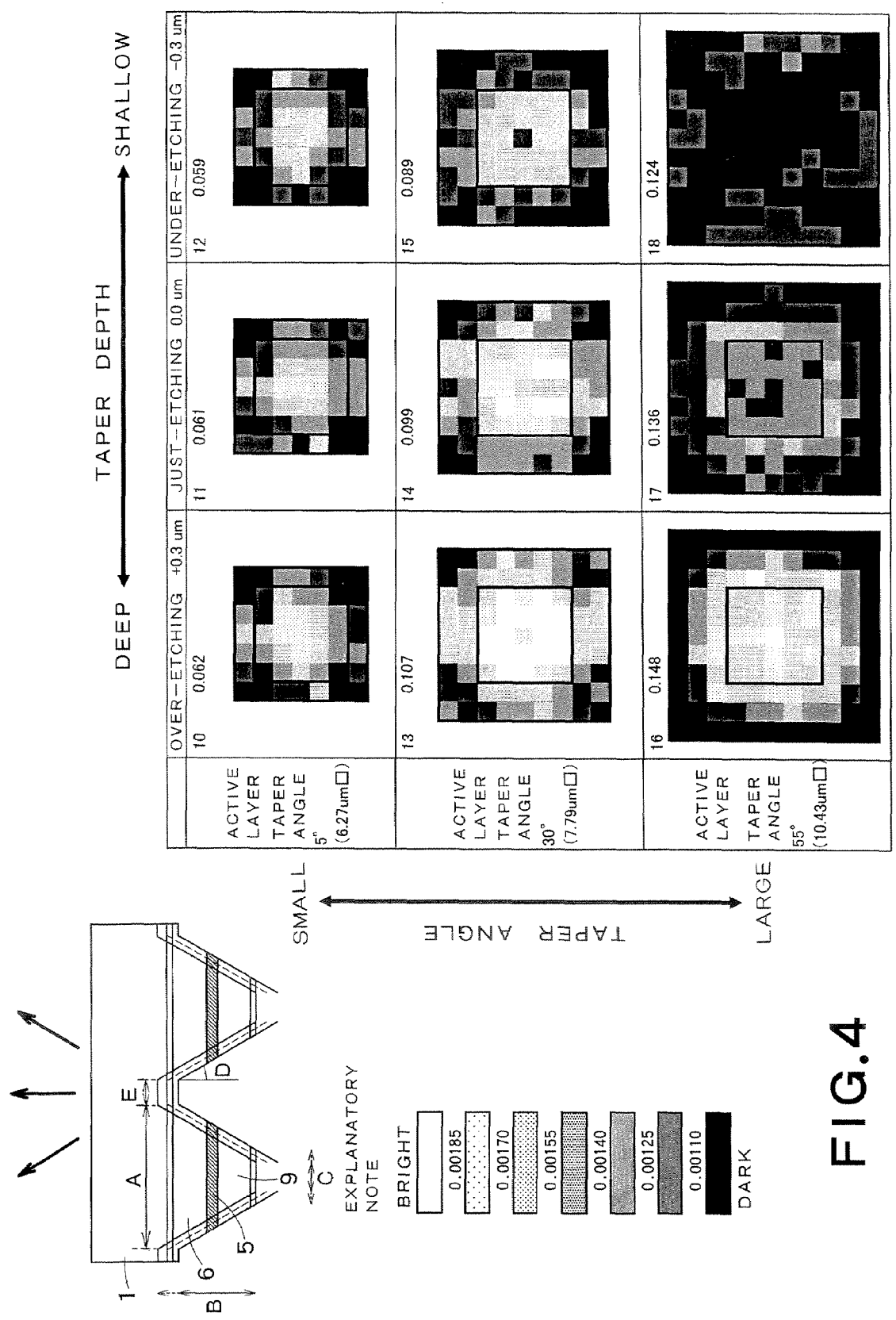
FIG. 4 is a figure showing the effect of taper angle D and taper depth B on the light intensity distribution when the interval E between adjacent light emitting sections 2 is set to 1 μm.

FIG. 3 is a drawing showing the effect of the taper angle D and the taper depth B on the light intensity distribution when the interval E between adjacent light emitting sections 2 is set to zero. On the other hand, FIG. 4 is a drawing showing the effect of the taper angle D and the taper depth B on the light intensity distribution when the interval E between adjacent light emitting sections 2 is set to 1 μm. FIG. 3 and FIG. 4 show the light intensity distribution with respect to three kinds of taper angles D and three kinds of taper depths B. In FIG. 3 and FIG. 4, in order to form the tapered section 7, the case where etching is performed up to an interface between the first clad layer 6 and the transparent layer 1 is defined as the just etching, the case where the etching reaches the inside of transparent layer 1 beyond the interface is defined as the over-etching, and the case where the etching is stopped at the inside of the first clad 6 before reaching the interface is defined as the under-etching.

In FIG. 3 and FIG. 4, the inclination angle to the normal direction (depth direction) of the transparent layer 1 is defined as the taper angle D. The tapered section 7 is formed by etching as described below, but the shorter the etching time is, the shallower the taper depth B becomes.

As can be seen from FIG. 3, as the taper angle D is smaller, that is, as the tapered section 7 is closer to the direction perpendicular to the transparent layer 1, the variation in light intensity over the whole region of the light emitting section 2 tends to be reduced. When the taper angle D becomes large, the light intensity distribution varies depending upon the taper depth B.

Furthermore, as can be seen from FIG. 4, when adjacent light emitting sections 2 are arranged separately from each other, the light tends to be converged to the center of the light emitting section 2 However, when the taper depth B is shallow, the degree to which the light is converged to the center of the light emitting section 2 becomes low, so that the light intensity distribution is changed depending upon the taper angle D.

In this way, the light intensity in the light emitting section 2 is not uniform, and is changed depending upon the taper angle D, the taper depth B, the interval E between adjacent light emitting sections 2, the ratio of the length of the flat section 8 to the horizontal length of the light emitting section 2, and the like. However, the light intensity distribution in the light emitting section 2 generally tends to be classified into the following two cases, that is, a case where the light intensity at the central portion in the light emitting section 2 is higher than that at the peripheral portion in the light emitting section 2, and a case where the light intensity at the peripheral portion in the light emitting section 2 is higher than that at the central portion in the light emitting section 2. In either of the cases, it is possible to efficiently take out the light to the outside by arranging each of the contact sections 3, which are arranged at the upper surface side of the transparent layer 1, at a position opposite to one of the peripheral portion and the central portion of the light emitting sections 2, that is, at a position opposite to one of the portions in which the intensity of light emitted to the direction of the transparent layer 1 is lower than that in the other portion.

When the light intensity of the central portion in the light emitting section 2 is the same as that of the peripheral portion, the contact section 3 may be arbitrarily arranged to either of the position opposite to the central portion and the position opposite to the peripheral portion on the upper face of the transparent layer.

Figure 12:
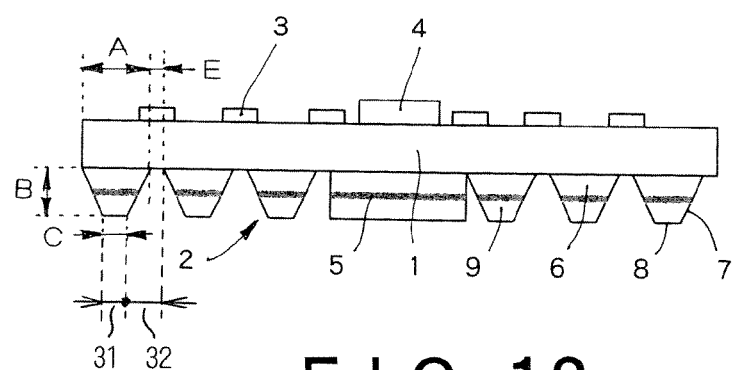
FIG. 12 is a sectional view of a major portion of a semiconductor light emitting device according to a second embodiment of the present invention.

Here, the central portion of the emitting section 2 is substantially equal to the flat section 8 in FIG. 1, and the peripheral portion of the emitting section 2 is substantially equal to an area between the neighboring two flat sections 8. In FIG. 1 and FIG. 12 described below, the central portion is denoted as reference numeral "31", and the peripheral portion is denoted as reference numeral "32".

The present embodiment described hereinafter assumes a case where the light intensity of the peripheral portion in the light emitting section 2 is higher than that of the central portion. In this case, the contact section 3 is arranged in a position opposite to the central portion of the light emitting section 2. Therefore, most of the light emitted from the light emitting section 2 is taken out to the outside, without being shielded by the contact section 3.

When the over-etching is performed to form the light emitting section 2, a gap is produced between the neighboring light emitting sections 2. When the gap is too large, unevenness or reduction in the light intensity is caused, and such unevenness or reduction in the light intensity is not preferable. For example, the length of the surface of the light emitting section 2 which is in contact with the transparent layer 1 is about 10 μm, the length of the flat section 8 is about 5 μm, and the length of the tapered section 7 is about 5 μm. Furthermore, it is preferable to suppress the gap between the respective light emitting sections 2 to about 0.3 μm or less.

FIG. 5 is a top view of a semiconductor light emitting device according to the present embodiment. In FIG. 5, the light emitting sections 2 are shown by dotted lines. A plurality of belt-shaped contact sections 3 are arranged in the y direction (in the front and rear direction of the paper surface in FIG. 1), and each contact section 3 is mainly arranged in a position opposite to the central portion of the light emitting section 2. The contact sections 3 are partially arranged to the peripheral portion of the light emitting sections 2 to connect the neighboring light emitting sections 2. A pad 4 which is arranged to be conductive to the contact sections 3 is formed in the central portion of the transparent layer 1. The pad 4 and the belt-shaped contact sections 3 are directly connected with each other, or electrically connected with each other via the contact sections 3 which are extended in the x direction. The contact sections 3 extended in the x direction are also arranged in positions that are opposite to the central portion of the light emitting sections 2.

FIG. 5 shows an example in which rectangular light emitting sections 2 are arranged in the two-dimensional direction (in the x-y direction), but as shown in FIG. 6, line-shaped light emitting sections 2 may also be arranged in parallel with each other. Furthermore, the arrangement of the contact sections 3 is not limited to that shown in FIG. 5. FIG. 7 is a top view showing an example in which a plurality of contact sections 3 are arranged in the diagonal direction with respect to the direction in which light emitting sections 2 are arranged. Also in this case, each contact section 3 is arranged in a position opposite to the central portion of the light emitting section 2, and each contact section 3 is electrically conductive to the pad 4 provided at the center of the transparent layer 1.

Alternatively, as shown in FIG. 8, a separated and independent contact section 3 may also be arranged in a position opposite to the central portion of each of the light emitting sections 2. In the case of FIG. 8, the pad 4 is arranged to be electrically conductive to each of the contacts sections 3 via transparent electrodes (not shown) which are arranged between the pad 4 and each of the contact sections 3.

The length and width of each contact section 3 are preferably set in accordance with the light emitting characteristic of the light emitting section 2. When the width of the contact section 3 is set to be too broad, the region which shields the light from light emitting section 2 may be increased. On the contrary, when the width of the contact section 3 is set to be too narrow, the resistance of the electrode portion may be increased. In FIG. 5, the continuous contact sections 3 are formed for each column along the y direction of the transparent layer 1. However, the contact section 3 of each column may be arranged to be divided into a plurality of pieces in order to make conductance with the pads 4 by transparent electrodes (not shown) and the like. The structure is the same even in FIGS. 6 and 7. Furthermore, in FIG. 8, a rectangular short-sized contact section 3 is arranged at the central portion of each of the light emitting sections 2, but the length and shape of each contact section 3 may be suitably changed.

Figure 9:
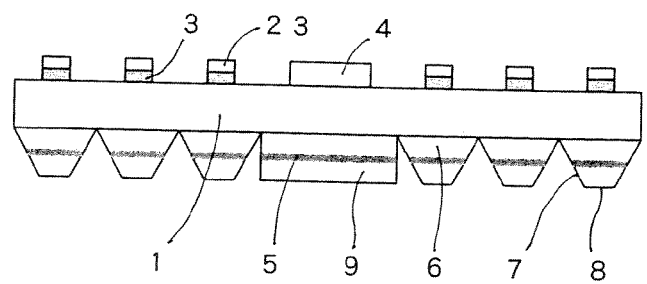
FIG. 9 is a sectional view of a major portion of a semiconductor light emitting device in the case where a contact section 3 made of GaAs or the like and a metal are laminated.

The contact section 3 may be formed of a compound semiconductor such as GaAs or a metal. The metal is usually opaque with respect to the light emitting wavelength of the light emitting section 2. However, according to the present embodiment, the contact section 3 is not arranged at the place where the light intensity in the light emitting section 2 is high, and hence, the light emission efficiency is not reduced so much even by the use of the metal. However, it is preferable to make the size of metal as small as possible. Alternatively, as shown in FIG. 9, the contact section 3 formed of GaAs or the like and the metal 23 may be laminated. In this case, the resistance of the contact section 3 can be lowered. It is at least necessary that the metal 23 is formed of a material such as AuGe or Ni/Au/Ge, by which an ohmic connection with GaAs can be formed. As a material of the metal 23, it is conceivable to use Au, Ge, Ni, Pt, Pd, Mo, Ti, Zn, In, Al, Ag, Cu. and the like.

Figure 10:
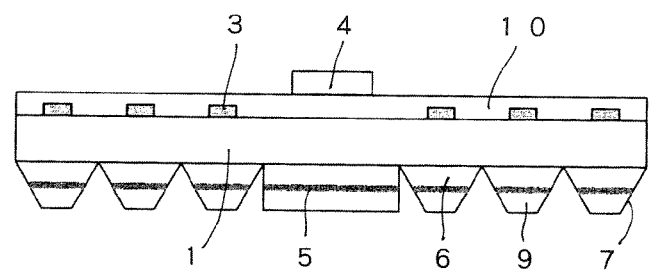
FIG. 10 is a sectional view of a major portion of a semiconductor light emitting device in the case where a pad 4 is formed on a transparent electrode layer 10.

Alternatively, a transparent electrode layer is formed on the whole transparent layer 1 on which the contact sections 3 are formed. The pad 4 may be formed on this transparent electrode layer. The cross-sectional constitution in this case is shown in FIG. 10. When arranging the transparent electrode layer 10, it is preferable to arrange a metal having an excellent adhesion characteristic on the lower surface of the transparent electrode layer 10 or the top. As a metal suitable for adhesion, there is Ti, Mo or the like. Alternatively, a metal such as Au, Pt and Pd may be laminated.

In the case where InGaAlP is adopted as a material of the transparent layer 1, it is difficult to make the transparent electrode layer 10 and the transparent layer 1 electrically conductive to each other, but the resistance between the transparent electrode layer 10 and the transparent layer 1 can be reduced by arranging the contact section 3 between the layers.

Figure 11:
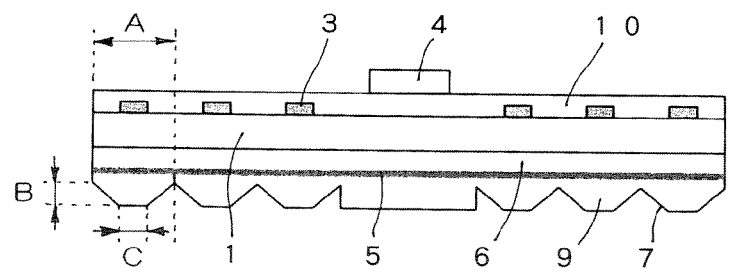
FIG. 11 is a sectional view of a major portion of a semiconductor light emitting device, showing an example in which tapered sections 7 are formed so as to be shallow enough to prevent an active layer 5 from being divided.

In FIG. 1 to FIG. 10 as described above, examples in which the active layer 5 in the light emitting section 2 is divided by the tapered section 7 have been explained. However, even when the active layer 5 is not divided by the tapered section 7, the light emission efficiency can be improved by reflecting the light from the active layer 5 by the tapered section 7. FIG. 11 is a sectional view of a major portion of a semiconductor light emitting device, showing an example of the under-etching, in which the tapered sections 7 are processed and formed at a depth shallow enough to prevent the active layer 5 from being divided. Also in the case of FIG. 11, the contact sections 3 are arranged opposite to positions where the light intensity of the respective light emitting sections 2 is low. Therefore, it is possible to improve the light taking-out efficiency.

In FIG. 1 and FIG. 2, the examples in which several light emitting sections 2 are arranged in the x-y direction, respectively, have been explained, but in particular, there is no restriction in the number of light emitting sections 2. For example, it is possible to realize a semiconductor light emitting device with high luminance by packaging several tens light emitting sections 2 which are respectively formed in the x-y direction, as one chip.

As described above, according to the first embodiment, the contact section 3 which is opaque to the light emitting wavelength of the light emitting section 2 is arranged in the position where the intensity of light from the light emitting section 2 is low, specifically in the position opposite to the central portion in the light emitting section 2. Therefore, the contact section 3 can be prevented from becoming an obstacle in taking out the light, and the light emission efficiency can be improved.

SECOND EMBODIMENTS

In the above described first embodiment 1, the position forming the contact section 3 has been described in the case where the light intensity of the peripheral portion of the light emitting section 2 is higher than that in the central portion thereof. The second embodiment described below is directed to the case where the light intensity of the central portion of the light emitting section 2 is higher than that of the peripheral portion thereof.

FIG. 12 is a sectional view of a major portion of a semiconductor light emitting device according to the second embodiment of the present invention. The semiconductor light emitting device in FIG. 12 has the same structure as that shown in FIG. 1, except that the position forming the contact section 3 is different from the position in FIG. 1. In FIG. 12, "A" denotes the width of one light emitting section, "B" denoted the taper depth, "C" is the width of the flat section 8, and "E" denotes an interval E between neighboring light emitting sections 2 (see FIG. 12).

In the light emitting section 2 of FIG. 12, contrary to the first embodiment, the light intensity in the vicinity of the center of the light emitting section 2 is higher than the light intensity at the peripheral portion of the light emitting section 2. As described above with reference to FIG. 3 and FIG. 4, such light intensity characteristic of the light emitting section 2 is exhibited in the case where adjacent light emitting sections 2 are arranged so as to be spaced apart from each other. Alternatively, it is also possible to increase the light intensity in the vicinity of the center of the light emitting section 2 even by adjusting the taper angle D and the taper depth B, for example, by performing the over-etching when the light emitting section 2 is formed.

As can be seen from FIG. 12, when the light intensity in the vicinity of the center of the light emitting section 2 is high, the contact section 3 is arranged on the upper surface side of the transparent layer 1 so as to be opposite to the peripheral portion of the light emitting section 2 or to the portion between the adjacent light emitting sections 2. Therefore, most of the light emitted from the light emitting section 2 is radiated to the outside without being shielded by the contact sections 3, thereby improving the light taking-out efficiency FIG. 13 is a top view of the present embodiment. As shown in the view, a plurality of belt-shaped contact sections 3 extended in the y direction are formed between the light emitting sections 2 which are arranged adjacent to each other in the x direction. The pad 4 is arranged in the central portion of the rectangular transparent layer 1. The pad 4 is connected to the contact sections 3 extended in the y direction, and to the contact sections 3 extended in the x direction. The contact sections 3 extended in the x direction are connected with the contact sections 3 extended in the y direction, thereby allowing all the contact sections 3 to be electrically connected with the pad 4. Since each of the contact sections 3 is arranged between the adjacent light emitting sections 2, the contact sections 3 hardly shield the light emitted mainly from the central portion of the light emitting section 2.

Figure 15:
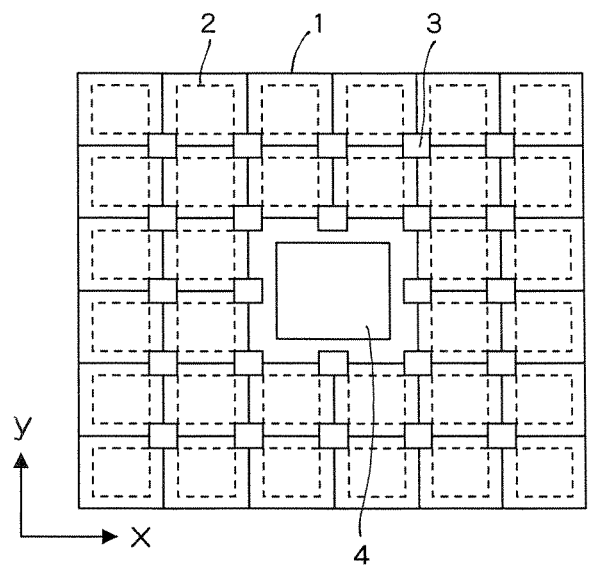
FIG. 15 is a top view in the case where rectangular short-sized contact sections 3 are arranged at corners of respective light emitting sections 2.

The arrangement of the contact section 3 is not necessarily limited to that shown in FIG. 13. For example, a plurality of contact sections 3 may be formed in the diagonal direction with respect to the direction in which the light emitting sections 2 are arranged, as shown in FIG. 14. In this case, unlike FIG. 7, the contact sections 3 are arranged so as not to pass through the positions that are opposite to the central portions of the light emitting sections 2. Alternatively, as shown in FIG. 15, a plurality of separated and independent contact sections 3 may also be arranged in the positions opposite to the corners of the light emitting sections 2, respectively. In this case, the contact sections 3 are arranged to be conductive to the pad 4 via transparent electrodes and the like which are arranged on the contact sections 3, as described below.

The contact section 3 is formed of the same material as that in the first embodiment, and various materials, such as GaAs, a metal and a laminated structure of GaAs and the metal, can be applicable to the contact section 3.

It is preferable that the length and width of the respective contact sections 3 are set in accordance with the light emitting characteristic of the light emitting section 2 If the width of contact section 3 is too broad, a region where the light from the light emitting sections 2 is shielded increases undesirably. On the contrary, if the width of contact section 3 is too narrow, the resistance of the electrode portion increases undesirably. In FIG. 13, a continuous contact section 3 is formed for each column along the y direction on the transparent layer 1, but the contact section 3 for each column may also be arranged so as to be divided into a plurality of sections. FIG. 14 has the same structure that of FIG. 13. Furthermore, in FIG. 15, rectangular short-sized contact sections 3 are arranged opposite to the corners of the respective light emitting section 2, but the length and shape of the respective contact sections 3 can be arbitrarily set.

Figure 16:
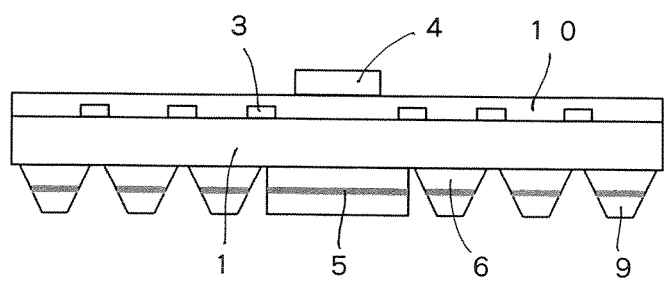
FIG. 16 is a sectional view of a major portion of a semiconductor light emitting device in the case where a transparent electrode is formed on the entire surface of a transparent layer 1 on which contact sections 3 are formed, and a pad 4 is formed on the transparent electrode.

FIG. 16 is a sectional view of a major portion of a semiconductor light emitting device in the case where a transparent electrode is formed on the entire surface of the transparent layer 1 on which contact sections 3 are formed, and the pad 4 is formed on the transparent electrode. In the case of FIG. 16, the contact sections 3 are electrically conductive to the pad 4 via the transparent electrode layer 10.

Figure 17:
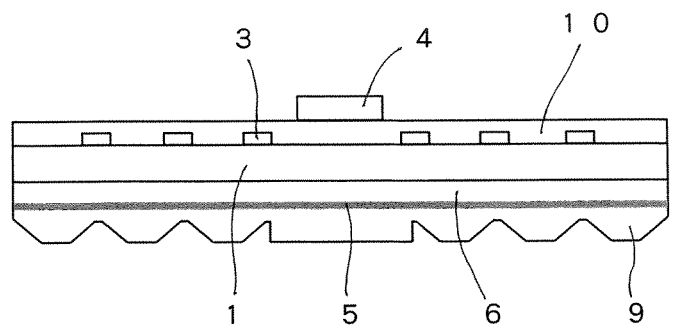
FIG. 17 is a sectional view of a major portion of a semiconductor light emitting device, having tapered sections 7 which are shallow enough to prevent an active layer 5 from being divided.

In the case of the present embodiment, it is not necessarily inevitable to form the tapered section 7 of the light emitting section 2 up to the depth at which the active layer 5 is divided. FIG. 17 is a sectional view of a major portion of a semiconductor light emitting device, having tapered sections 7 which are shallow enough to prevent the active layer 5 from being divided Also in FIG. 17, a part of light emitted from the active layer 5 is reflected by the tapered section 7 and proceeds in the direction toward the transparent layer 1, thereby improving the light taking-out efficiency.

As shown in FIG. 4, when the interval E between adjacent light emitting sections 2 increases, the light tends to be converged to the central portion of the light emitting section 2. Thus, as in the present embodiment, the contact section 3 is preferably arranged opposite the peripheral portion of the light emitting section 2, and the interval between the adjacent light emitting sections 2 is preferably set to about 0.3 µm or more. On the contrary, if the area of the active layer 5 is small, the light emitting efficiency deteriorates. Therefore, it is desirable that the interval E is narrow in view of the light emitting efficiency. In view of both, the upper limit of interval E of the light emitting section 2 is practically set to substantially ⅓ of an interval (cycle) of the light emitting section 2 (A+E).

Next, a manufacturing process of the semiconductor light emitting device according to the second embodiment is explained. Note that the manufacturing process of the semiconductor light emitting device according to the first embodiment is fundamentally the same as that according to the second embodiment.

FIG. 18 to FIG. 20 are figures for explaining the manufacturing process of the semiconductor light emitting device according to the present embodiment, and show a manufacturing process in the case where there is a flat gap between two adjacent light emitting sections 2. In the following, the manufacturing process is explained with reference to the drawings.

Figure 18A:
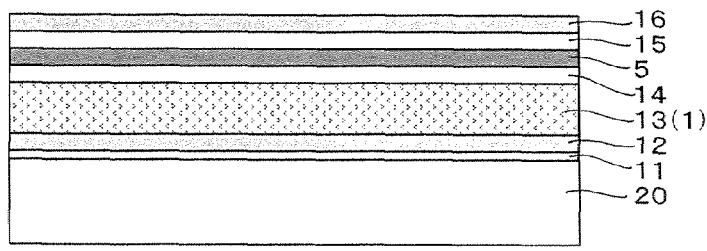
FIG. 18 is a figure explaining a manufacturing process of the semiconductor light emitting device according to the present embodiment.

First, an InGaAlP etching stop layer 11, a n-GaAs contact layer 12, an InGaAlP current diffusion layer 13, a n-InAlP clad layer 14, an InGaAlP/InGaP active layer 5 in which a plurality of layers of InGaAlP and InGaP are alternately laminated, a p-InAlP clad layer 15, and a p-GaAs contact layer 16 are formed in order on a GaAs substrate 20 by the MOCVD method (FIG. 18(A)). The InGaAlP current diffusion layer 13 corresponds to the transparent layer 1 in FIG. 1 and the like.

Figure 18B:
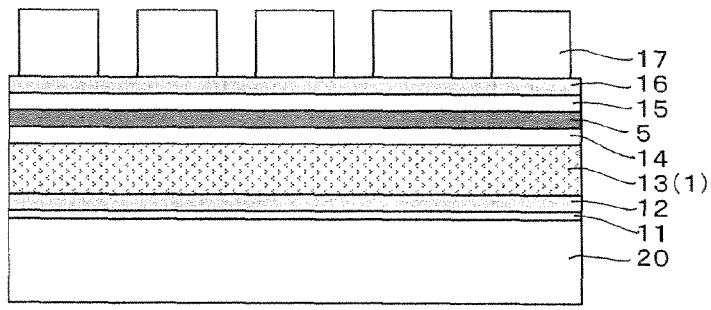
Figure 18C:
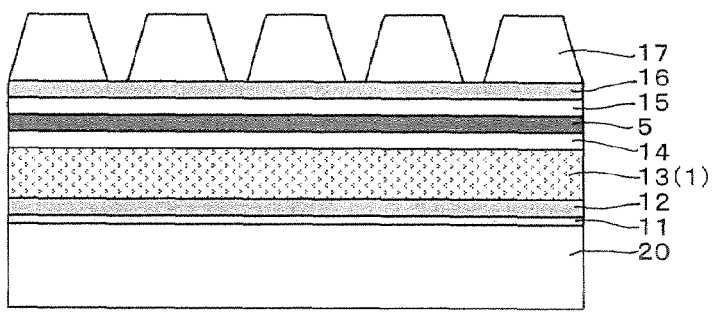

Next, a resist 17 is adhered on the GaAs substrate 20, and is patterned in conformity to the position of the light emitting section 2 (FIG. 18(B)). Next, the edge portion of the resist 17 is processed into a tapered shape by heat treatment (FIG. 18(C)). The adjacent resists are separated from each other in FIG. 18(C). However, it is possible to make the distance between adjacent resists 17 formed into zero, by changing the pattern shape and the heat treatment time of the resist 17, when the resist is processed into the tapered shape.

Figure 18D:
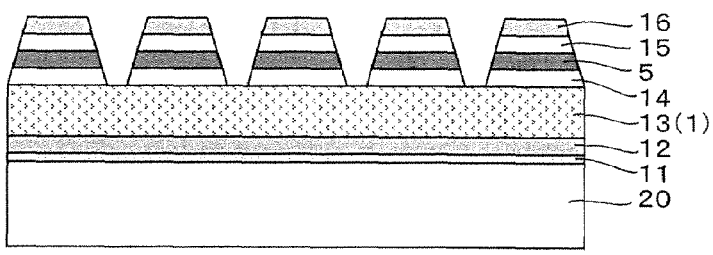

Next, RIE (Reactive Ion Etching) is performed by using the resist 17 as a mask, so that the p-GaAs contact layer 16, the p-InAlP clad layer 15, the InGaAlP/InGaP active layer 5, and the n-InAlP clad layer 14 are processed into the tapered shape so as to correspond to the shape of the resist 17 (FIG. 18(D)). Here, in order to enable the resist shape to be transferred, a condition is set such that the resist 17 and the respective layers at the lower surface side of the resist 17, are etched at a substantially uniform speed.

Note that the first clad layer 6 shown in FIG. 1, FIG. 2 and the like corresponds to the n-InAlP clad layer 14, and the second clad layer 9 corresponds to the p-InAlP clad layer 15 and the p-GaAs contact layer 16.

Figure 19A:
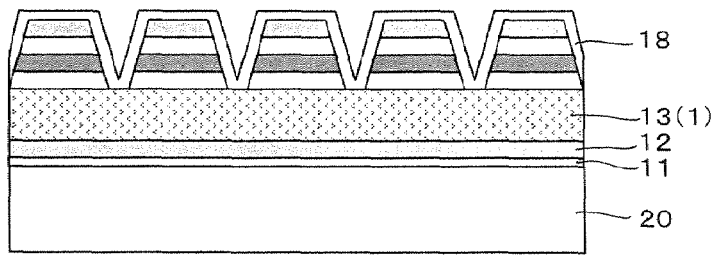
FIG. 19 is a process chart following the manufacturing process shown in FIG. 18.

Next, an oxide film 18 is formed on the entire substrate (FIG. 19(A)). Here, as the oxide film, for example, it is possible to use silicon oxide, silicon nitride, silicon oxynitride (SiON) or the like. Next, a resist is adhered on the upper surface of the oxide film 18, and is patterned. Then, the oxide film 18 is etched to be partially removed by using the resist as a mask, so that contact holes for forming electrodes are formed.

Figure 19B:
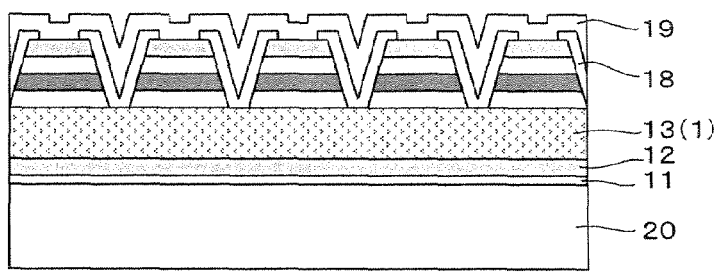

Next, a metal 19 for p electrode is formed on the entire substrate (FIG. 19(B)). This metal 19 is also formed on the tapered section 7, and serves as a reflective film which reflects the light from the active layer 5. The metal 19 may be formed by a laminated film, but the outermost surface of the metal 19 is formed of an Au thick film (1 µm) having excellent conductivity.

Figure 19C:
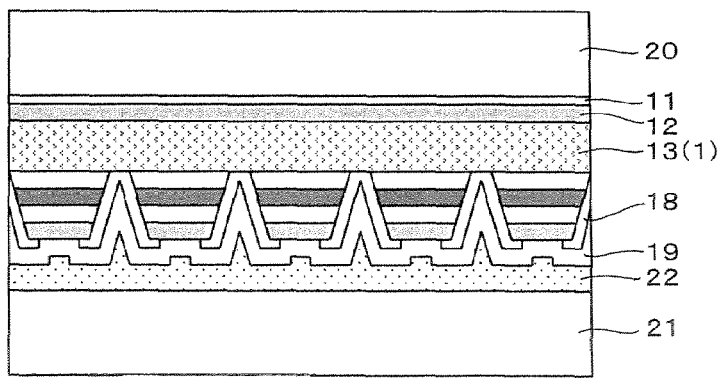

Next, Si wafer 21 is adhered on the formation surface of metal 19 (FIG. 19(C)).

More specifically, an Au thick film 22 is formed beforehand on the surface of the Si wafer 21, and then the Au thick film 22 and the Au thick film on the outermost surface of the metal 19 are adhered to each other.

Instead of using Au thick film 22, the other metal material or a laminated film including metal may be used. As a material of the metal 19, for example, Ti/Pt/Au, AuGe/Mo/Au or AuZn/Mo/Au is used. As a material of the outermost surface of the metal 19, AuSn (eutectic alloyed metal) or the like is applicable.

Next, the GaAs substrate 20 on the side opposite to the adhesion surface is removed by etching using ammonia/hydrogen peroxide solution, and subsequently, the InGaAlP etching stop layer 11 is removed by etching using chlorine.

Figure 19D:
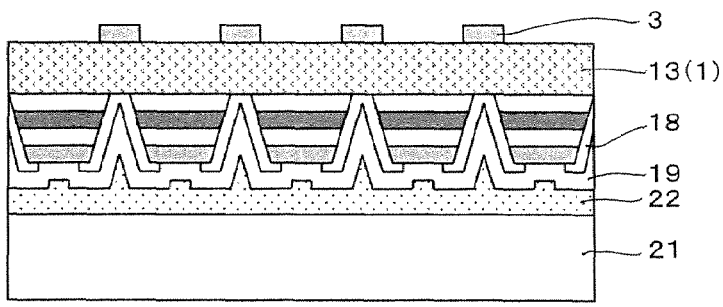

Next, a resist is adhered on the n-GaAs contact layer 12 and patterned, and thereafter, the n-GaAs contact layer 12 is partially removed by etching so that the contact sections 3 are formed (FIG. 19(D)). The contact sections 3 are formed in regions where the light intensity is low, that is, in the case of the present embodiment, at positions that are opposite to the peripheral portions of the light emitting section 2 or to the positions between adjacent light emitting sections 2.

In the case where the contact sections 3 are directly connected to the pad 4, the pad 4 is subsequently formed, and the manufacturing process is finished. In the case where a transparent electrode is formed on the contact section 3, the transparent electrode layer 10 is formed on the entire transparent layer 1 (FIG. 20(A)). Thereafter, the pad 4 is formed on the transparent electrode layer 10.

On the other hand, when a metal is formed on the contact section 3, the process shown in FIG. 19C is performed, and then the GaAs substrate 20 and the InGaAlP etching stop layer 11 are etched, and then the metal 23 is formed on the n-GaAs contact layer 12 by the lift-off method (FIG. 20C). Next, the n-GaAs contact layer 12 is partially removed by etching using the metal 23 as a mask (FIG. 20(C)).

Also in the second embodiment, the metal 23 may be laminated on the contact section 3, similarly to the case in FIG. 9.

In this way, according to the second embodiment, when the light intensity in the vicinity of the center of the light emitting section 2 is higher than that of the peripheral portion of the light emitting section 2, the contact section 3 is arranged in a position opposite to the peripheral portion of the light emitting section 2 or to the position between adjacent light emitting sections 2. Therefore, most of the light emitted from the light emitting section 2 is not shielded by the contact section 3, thereby enabling the light taking-out efficiency to be improved.

In the fabrication processes of the above embodiments, the examples of fabricating the InGaAlP based LED have been described. However, the present invention is not limited to the InGaAlP based LED. The present invention is also applicable to a GaN based LED. In this case, instead of forming the GaAs substrate 20, the n-GaAs contact layer 12, the InGaAlP current diffusion layer 13, the n-InAlP clad layer 14, the InGaAlp/InGaP active layer 5 obtained by alternatively laminating multiple InGaAlP layers and InGaP layers, the p-InAlP clad layer 15 and the p-GaAs contact layer 16, a substrate made of one of a SiC substrate, a sapphire substrate or a GaN substrate, an n-GaN contact layer, a GaN current diffusion layer, an n-AlGaN clad layer, an AlGaN/AlInGaN active layer obtained by alternatively laminating multiple AlGaN layers and AlInGaN (Aluminum Indium Gallium Nitride) layers, a p-AlGaN clad layer and a p-GaN contact layer may be used. Furthermore, in the case of the GaN based LED, the etching stop layer is not necessarily inevitable.

What is claimed is:

1. A semiconductor light emitting device, comprising:
   a transparent layer having a first main surface and a second main surface at a side opposite to the first main surface;
   a plurality of light emitting sections arranged in at least one line on the first main surface of the transparent layer, each of the plurality of light emitting sections having an active layer and a tapered section, the tapered section reflecting light emitted from the active layer to the direction of the transparent layer, each of the plurality of light emitting sections having a central portion and a peripheral portion and having light intensity distribution on a second main surface of the transparent layer, on the second main surface of the transparent layer, light intensity at a region opposite to the peripheral portion being equal to or more than light intensity at a region opposite to the central portion; and
   a plurality of contact sections arranged opposite to the central portion on the second main surface of the transparent layer, each of the plurality of contact sections being opaque with respect to emission wavelengths of the plurality of light emitting sections.

2. The semiconductor light emitting device according to claim 1, further comprising a flat section provided between the tapered sections corresponding to the neighboring two light emitting sections.

3. The semiconductor light emitting device according to claim 2,
   wherein each of the plurality of light emitting sections includes:
   a first clad layer formed on the first main surface of the transparent layer; and
   a second clad layer formed on the first clad layer through the active layer,
   the tapered section being formed inside of the transparent layer from the second clad layer through the active layer and the first clad layer.

4. The semiconductor light emitting device according to claim 2,
   wherein each of the plurality of light emitting sections includes:
   a first clad layer formed on the first main surface of the transparent layer; and
   a second clad layer formed on the first clad layer through the active layer,
   the flat section being provided inside of the second clad layer.

5. The semiconductor light emitting device according to claim 1, further comprising:
   a pad which is formed on the second main surface and is electrically conductive to the contact sections; and
   electrodes formed on end surfaces of the tapered sections.

6. The semiconductor light emitting device according to claim 1, further comprising a metal layer formed on the contact sections.

7. The semiconductor light emitting device according to claim 1, further comprising:
   a transparent electrode layer formed to cover the contact sections; and
   a pad which is formed on the transparent layer and is electrically conductive to the contact sections.

8. The semiconductor light emitting device according to claim 1,
   wherein the plurality of light emitting sections are arranged in units of a plurality of pieces in two dimension direction; and
   the plurality of contact sections are arranged substantially in parallel in a direction along which the plurality of light emitting sections are aligned.

9. The semiconductor light emitting device according to claim 1,
   wherein the plurality of light emitting sections are arranged in units of a plurality of pieces in two dimension direction; and
   the plurality of contact sections are arranged in a direction different from a direction along which the plurality of light emitting sections are aligned.

10. The semiconductor light emitting device according to claim 1,
    wherein the plurality of light emitting sections are arranged in units of a plurality of pieces in two dimension direction; and
    the plurality of contact sections are arranged to central portions of the plurality of light emitting sections.

* * * * *